US010627841B2

(12) United States Patent
Yi

(10) Patent No.: US 10,627,841 B2
(45) Date of Patent: Apr. 21, 2020

(54) REFERENCE VOLTAGE GENERATION CIRCUIT WITH REDUCED PROCESS VARIATION ON THE REFERENCE VOLTAGE

(71) Applicant: PHISON ELECTRONICS CORP., Miaoli (TW)

(72) Inventor: Bing-Wei Yi, Taichung (TW)

(73) Assignee: PHISON ELECTRONICS CORP., Miaoli (TW)

( * ) Notice: Subject to any disclaimer, the term of this patent is extended or adjusted under 35 U.S.C. 154(b) by 30 days.

(21) Appl. No.: 15/460,245

(22) Filed: Mar. 16, 2017

(65) Prior Publication Data
US 2018/0210478 A1 Jul. 26, 2018

(30) Foreign Application Priority Data

Jan. 26, 2017 (TW) .............................. 106103268 A

(51) Int. Cl.
G05F 1/575 (2006.01)
G11C 5/14 (2006.01)
G11C 16/30 (2006.01)

(52) U.S. Cl.
CPC .............. *G05F 1/575* (2013.01); *G11C 5/143* (2013.01); *G11C 5/145* (2013.01); *G11C 5/147* (2013.01); *G11C 16/30* (2013.01)

(58) Field of Classification Search
CPC ......... G05F 1/575; G11C 16/16; G11C 16/32; G11C 16/28; G11C 16/26
See application file for complete search history.

(56) References Cited

U.S. PATENT DOCUMENTS

| 9,973,089 | B1 * | 5/2018 | Terasawa | H02M 3/158 |
|---|---|---|---|---|
| 2013/0265807 | A1 * | 10/2013 | Lee | G05F 1/468 |
| | | | | 363/49 |
| 2014/0347130 | A1 * | 11/2014 | Iijima | H03F 1/0261 |
| | | | | 330/288 |
| 2015/0262694 | A1 * | 9/2015 | Seo | G06F 11/1068 |
| | | | | 714/764 |

FOREIGN PATENT DOCUMENTS

TW     200721165     6/2007

OTHER PUBLICATIONS

"Office Action of Taiwan Counterpart Application," dated Oct. 25, 2017, p. 1-p. 6, in which the listed reference was cited.

* cited by examiner

Primary Examiner — Sultana Begum
(74) Attorney, Agent, or Firm — JCIPRNET

(57) ABSTRACT

An exemplary embodiment of the disclosure provides a reference voltage generation circuit which includes a unit switch circuit and a voltage output circuit. The unit switch circuit is configured to receive a control voltage and generate a plurality of base voltages on a detection point inside the reference voltage generation circuit. The voltage output circuit is coupled to the unit switch circuit and is configured to modify a reference voltage for generating a specific voltage according to the base voltages. Therefore, an influence on the reference voltage due to process variation can be reduced.

39 Claims, 12 Drawing Sheets

REFERENCE VOLTAGE GENERATION CIRCUIT WITH REDUCED PROCESS VARIATION ON THE REFERENCE VOLTAGE

CROSS-REFERENCE TO RELATED APPLICATION

This application claims the priority benefit of Taiwan application serial no. 106103268, filed on Jan. 26, 2017. The entirety of the above-mentioned patent application is hereby incorporated by reference herein and made a part of this specification.

BACKGROUND

Technology Field

The disclosure relates to a voltage generation circuit, and particularly relates to a reference voltage generation circuit, a memory storage device and a reference voltage generation method.

Description of Related Art

Along with quick growth of digital cameras, mobile phones and MP3 players in recent years, user's demand on storage medium is rapidly increased. Since rewritable non-volatile memory module (for example, a flash memory) has characteristics of non-volatile, power-saving, small volume and non-mechanical structure, etc., it is very suitable for being built in the aforementioned various portable multimedia devices.

In an electronic device, different electronic circuits are probably operated in different working voltages. Therefore, the electronic device is generally configured with a circuit (which is also referred to as a reference voltage generator), which is specifically designed to provide a reference voltage, and voltage signals with different voltage values can be produced based on the reference voltage. A commonly used reference voltage generator is configured with a current mirror in internal thereof, which includes two transistors matched to each other. Gates of the two transistors matched to each other are coupled to the same control voltage and sources thereof are coupled to the same current source. In this way, the reference voltage is produced at an output terminal of one of the transistors.

However, due to a process difference of transistors, the transistors at two sides of the current mirror may have a process error there between, such that the generated reference voltage may have a variation in response to the process error. Conventionally, the reference voltage generators in internal of different chips are checked and adjusted one-by-one through manual confirmation, which results in a large labor cost. Alternatively, a chopper can be configured in the reference voltage generator to try to eliminate the variation, though an effect thereof is limited.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure is directed to a reference voltage generation circuit, a memory storage device and a reference voltage generation method, by which an influence on the reference voltage due to process error may be reduced An exemplary embodiment of the disclosure provides a reference voltage generation circuit, which includes a voltage supplying circuit, a unit switch circuit and a voltage output circuit. The voltage supplying circuit is configured to provide a control voltage. The unit switch circuit is coupled to the voltage supplying circuit and is configured to receive the control voltage and generate a plurality of base voltages on a detection point inside the reference voltage generation circuit. The voltage output circuit is coupled to the unit switch circuit and is configured to modify a reference voltage for generating a specific voltage according to the base voltages.

Another exemplary embodiment of the disclosure provides a memory storage device including a connection interface unit, a rewritable non-volatile memory module, a memory control circuit unit and a reference voltage generation circuit. The connection interface unit is coupled to a host system. The rewritable non-volatile memory module includes a plurality of physical units. The memory control circuit unit is coupled to the connection interface unit and the rewritable non-volatile memory module. The reference voltage generation circuit is disposed in the connection interface unit or the memory control circuit unit. The reference voltage generation circuit is configured to receive a control voltage and generate a plurality of base voltages on a detection point inside the reference voltage generation circuit. The reference voltage generation circuit is further configured to modify a reference voltage for generating a specific voltage according to the base voltages.

Another exemplary embodiment of the disclosure provides a reference voltage generation method, which is adapted to a memory storage device. The reference voltage generation method includes: receiving a control voltage and generating a plurality of base voltages on a detection point inside a reference voltage generation circuit; modifying a reference voltage according to the base voltages; and generating a specific voltage according to the modified reference voltage.

According to the above description, after the control voltage is received, the reference voltage generation circuit generates a plurality of base voltages at one detection point inside the reference voltage generation circuit. Then, the reference voltage generation circuit generates and modifies a reference voltage according to the base voltages. Thereafter, the reference voltage is used for generating a specific voltage. Compared to the technique of directly using an output voltage of a transistor located at one side of a current mirror as the reference voltage, the influence (variation) on the reference voltage due to process error of the transistors at two sides of the current mirror can be decreased.

In order to make the aforementioned and other features and advantages of the disclosure comprehensible, several exemplary embodiments accompanied with figures are described in detail below.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

Figure 1:
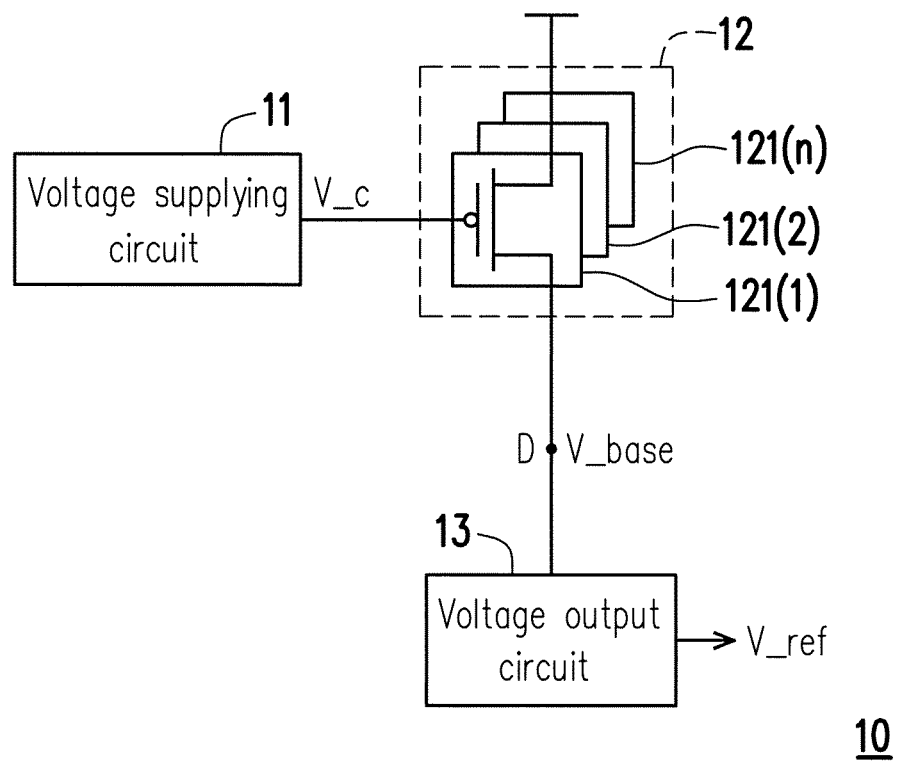
FIG. 1 is a generic function block schematic diagram of a reference voltage generation circuit according to an exemplary embodiment of the disclosure.

A plurality of exemplary embodiments are provided below to describe the disclosure, though the disclosure is not limited to the provided embodiments, and the provided embodiments can be suitably combined. A term "couple" used in the full text of the disclosure (including the claims) refers to any direct and indirect connections. For example, if a first device is described to be coupled to a second device, it is interpreted as that the first device is directly coupled to the second device, or the first device is indirectly coupled to the second device through other devices or connection means. Moreover, a term "signal" refers to at least a current, a voltage, a charge, a temperature, data, an electromagnetic wave or any other one or more signals.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "one or more" and "at least one" can be used interchangeably herein.

FIG. 1 is a generic function block schematic diagram of a reference voltage generation circuit according to an exemplary embodiment of the disclosure.

Referring to FIG. 1, the reference voltage generation circuit 10 includes a voltage supplying circuit 11, a unit switch circuit 12 and a voltage output circuit 13. The unit switch circuit 12 is coupled to the voltage supplying circuit 11 and the voltage output circuit 13. The voltage supplying circuit 11 is configured to generate a control voltage $V\_c$. The unit switch circuit 12 is configured to receive the control voltage $V\_c$ and generate a plurality of base voltages $V\_base$ on a detection point D inside the reference voltage generation circuit 10. For example, the detection point D is coupled to an output terminal of the unit switch circuit 12.

In the present exemplary embodiment, the unit switch circuit 12 includes a plurality of transistor units 121(1)-121(n), where n is a positive integer greater than 1. For example, in an exemplary embodiment, n is 128. In another exemplary embodiment, the value of n can be greater or smaller as long as it is a multiple of 2. Control terminals of the transistor units 121(1)-121(n) are all coupled to the voltage supplying circuit 11 and are configured to receive the control voltage $V\_c$. Input terminals of the transistor units 121(1)-121(n) are coupled to a current source or a voltage source. Output terminals of a part of the transistor units in the transistor units 121(1)-121(n) are coupled to the detection point D (i.e. the output terminal of the unit switch circuit 12). Moreover, one transistor unit may include one or a plurality of transistor components.

The unit switch circuit 12 executes a unit switch operation to the transistor units 121(1)-121(n). For example, in the unit switch operation, at least one transistor unit in the transistor units 121(1)-121(n) that is not coupled to the detection point D originally is probably switched to being coupled to the detection point D, and at least one transistor unit in the transistor units 121(1)-121(n) that is originally coupled to the detection point D is probably switched to being uncoupled to the detection point D. Corresponding to the executed unit switch operation, the base voltage $V\_base$ on the detection D is changed. For example, if the unit switch circuit 12 currently generates a base voltage (which is also referred to as a first base voltage) having a voltage value on the detection point D, then after the unit switch operation is executed, the unit switch circuit 12 generates another base voltage (which is also referred to as a second base voltage) having different voltage value on the detection point D.

In an exemplary embodiment, the plurality of base voltages $V\_base$ are sequentially generated based on a plurality of clock edges of an clock signal. The plurality of clock edges may refer to a plurality of continuous rising edges, a plurality of continuous falling edges, a plurality of discontinuous rising edges or a plurality of discontinuous falling edges of the clock signal. For example, the unit switch operation is executed based on one clock edge of the clock signal, such that the voltage on the detection point D is changed from the first base voltage to the second base voltage. Corresponding to the plurality of clock edges, the unit switch operation is repeatedly executed, so as to generate the plurality of base voltages V_base.

The voltage output circuit 13 is configured to sequentially receive the plurality of base voltages V_base on the detection point D and generate a reference voltage V_ref according to the plurality of base voltages V_base. It should be noted that, in the operation of sequentially generating the plurality of base voltages V_base, the voltage value of the reference voltage V_ref is modified. For example, the voltage value of the modified reference voltage V_ref may be more and more close to an average voltage value of the plurality of base voltages V_base. In an exemplary embodiment, the final reference voltage V_ref generated according to the base voltages V_base is in a stable state. For example, the voltage value of the reference voltage V_ref in the stable state is equal to (or rather close to) the average voltage value of the plurality of base voltages V_base. In an exemplary embodiment, the voltage value of the reference voltage V_ref in the stable state can also be regarded as the average voltage value of the plurality of base voltages V_base. In an exemplary embodiment, a total number of the base voltages V_base used for generating the reference voltage V_ref in the stable state is n/2, and n/2 is also a positive integer. For example, if it is assumed that the total number of the transistor units 121(1)-121(n) is 128, then after 64 times of the unit switch operations are executed, the reference voltage V_ref in the stable state is generated.

Figure 2:
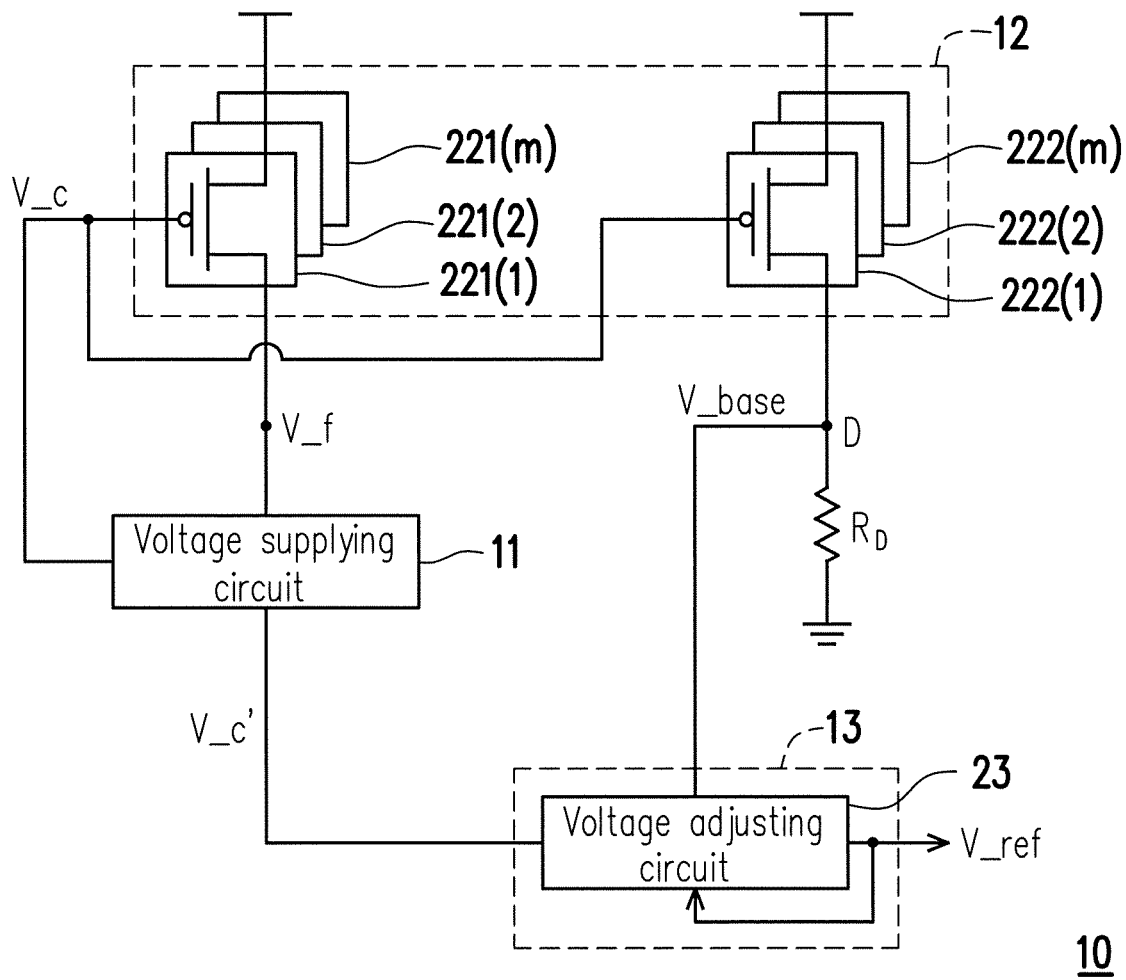
FIG. 2 is a detailed function block schematic diagram of a reference voltage generation circuit according to an exemplary embodiment of the disclosure.

FIG. 2 is a detailed function block schematic diagram of a reference voltage generation circuit according to an exemplary embodiment of the disclosure.

Referring to FIG. 2, in the present exemplary embodiment, the unit switch circuit 12 includes transistor units (which are also referred to as first type transistor units) 221(1)-221(m) and transistor units (which are also referred to as second type transistor units) 222(1)-222(m), where m is a positive integer greater than 1. For example, m is equal to n/2. Control terminals of the transistor units 221(1)-221(m) and the transistor units 222(1)-222(m) are all coupled to the voltage supplying circuit 11 and are configured to receive the control voltage V_c. Output terminals of the transistor units 221(1)-221(m) are all coupled to the voltage supplying circuit 11 and are configured to provide a feedback voltage V_f to an input terminal of the voltage supplying circuit 11. The voltage supplying circuit 11 receives the feedback voltage V_f and accordingly outputs the control voltage V_c. Output terminals of the transistor units 222(1)-222(m) are all coupled to the detection point D and are configured to provide the base voltages V_base on the detection point D. Moreover, an impedance unit $R_D$ is connected in series between the detection point D and a ground level, where the impedance unit $R_D$ includes at least one resistor component, etc., that is used for providing an impedance value (for example, a resistance value or a reactance value).

In an exemplary embodiment, the transistor units 221(1)-221(m) can be regarded as a transistor group located at one side of a current mirror circuit, and the transistor units 222(1)-222(m) can be regarded as another transistor group located at another side of the same current mirror circuit. For example, input terminals of the transistor units 221(1)-221(m) are coupled to a current source, and input terminals of the transistor units 222(1)-222(m) are coupled to a voltage source. Through the current mirror mapping, the unit switch circuit 12 may generate a current (which is also referred to as a mapping current) flowing through the transistor units 222(1)-222(m) according to a current (which is also referred to as a reference current) flowing through the transistor units 221(1)-221(m).

In an exemplary embodiment, a certain transistor unit belonging to the transistor units 221(1)-221(m) or belonging to the transistor units 222(1)-222(m) can be dynamically changed. For example, in a unit switch operation, a certain transistor unit (which is also referred to as a first transistor unit) serving as one of the first type transistor units may be changed to serve as one of the second type transistor units, and a certain transistor unit (which is also referred to as a second transistor unit) serving as one of the second type transistor units may be changed to serve as one of the first type transistor units. In an exemplary embodiment, the operation of changing the first transistor unit serving as one of the first type transistor units to situation of serving as one of the second type transistor units is also referred to as a first unit switch operation, and the operation of changing the second transistor unit serving as one of the second type transistor units to situation of serving as one of the first type transistor units is also referred to as a second unit switch operation.

In an exemplary embodiment, by changing a connecting object of an output terminal of a certain transistor unit, the type of the transistor unit can be changed. For example, if the output terminal of a certain transistor unit is electrically connected to the voltage supplying circuit 11, it may be regarded that the transistor unit currently belongs to the transistor units 221(1)-221(m) (i.e., the first type transistor units). If the output terminal of the above transistor unit is switched to electrically connect the detection point D (or the voltage output circuit 13), it may be regarded that the transistor unit currently belongs to the transistor units 222(1)-222(m) (i.e., the second type transistor units). In an exemplary embodiment, changing of a connecting object of an output terminal of a certain transistor unit can be regarded as changing of a circuit loop to which the transistor unit belongs. For example, if a circuit loop to which a certain transistor unit belongs includes providing an output terminal voltage of the transistor unit to the voltage supplying circuit 11, it may be regarded that the transistor unit currently belongs to the transistor units 221(1)-221(m). If the transistor unit is switched to belong to another circuit loop such that the output terminal voltage of the transistor unit is no longer provided to the voltage supplying circuit 11, it may be regarded that the transistor unit currently belongs to the transistor units 222(1)-222(m).

FIGS. 3A-3D are schematic diagrams of a unit switch operation according to an exemplary embodiment of the disclosure.

Figure 3A:
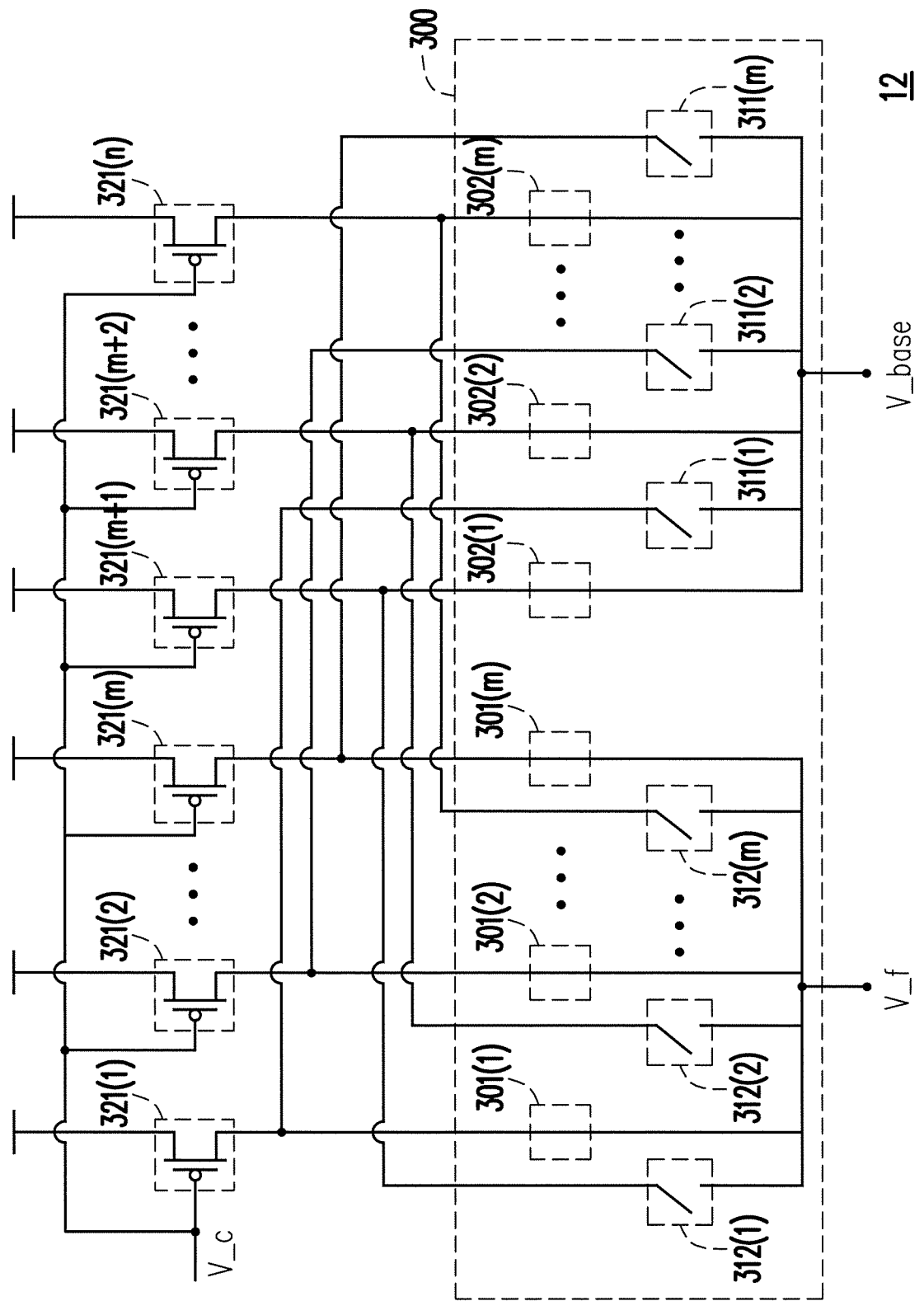
FIGS. 3A-3D are schematic diagrams of a unit switch operation according to an exemplary embodiment of the disclosure.

Referring to FIG. 2 and FIG. 3A, in the present exemplary embodiment, the unit switch circuit 12 includes transistor units 321(1)-321(n) and a switch module 300. The input terminals of the switch module 300 are coupled to the transistor units 321(1)-321(n). The first output terminals of the switch module 300 are coupled to the voltage supplying circuit 11, and the switch module 300 provides a feedback voltage V_f through the first output terminals. The second output terminals of the switch module 300 are coupled to the detection point D, and the switch module 300 provides the base voltages V_base through the second output terminals. In the present exemplary embodiment, the unit switch operation refers an operation of changing a state of at least one switch unit in the switch module 300.

In the present exemplary embodiment, the switch module 300 includes switch units 301(1)-301(m), 311(1)-311(m), 302(1)-302(m) and 312(1)-312(m). The switch units 301(1)-

301(*m*) are respectively coupled between the transistor units 321(1)-321(*m*) and the voltage supplying circuit 11. The switch units 311(1)-311(*m*) are respectively coupled between the transistor units 321(1)-321(*m*) and the detection point D. The switch units 302(1)-302(*m*) are respectively coupled between the transistor units 321(*m*+1)-321(*n*) and the detection point D. The switch units 312(1)-312(*m*) are respectively coupled between the transistor units 321(*m*+1)-321(*n*) and the voltage supplying circuit 11. By adjusting the state of a certain switch unit in the switch module 300, whether a certain transistor unit in the transistor units 321(1)-321(*n*) belongs to the first type transistor unit or the second type transistor unit can be determined.

In the exemplary embodiment of FIG. 3A, each of the switch units 301(1)-301(*m*) and 302(1)-302(*m*) is in a turn-on state, and each of the switch units 311(1)-311(*m*) and 312(1)-312(*m*) is in a turn-off state. In this case, the transistor units 321(1)-321(*m*) coupled to the voltage supplying circuit 11 belong to the first type transistor units, and the transistor units 321(*m*+1)-321(*n*) coupled to the detection point D belong to the second type transistor units.

Figure 3B:
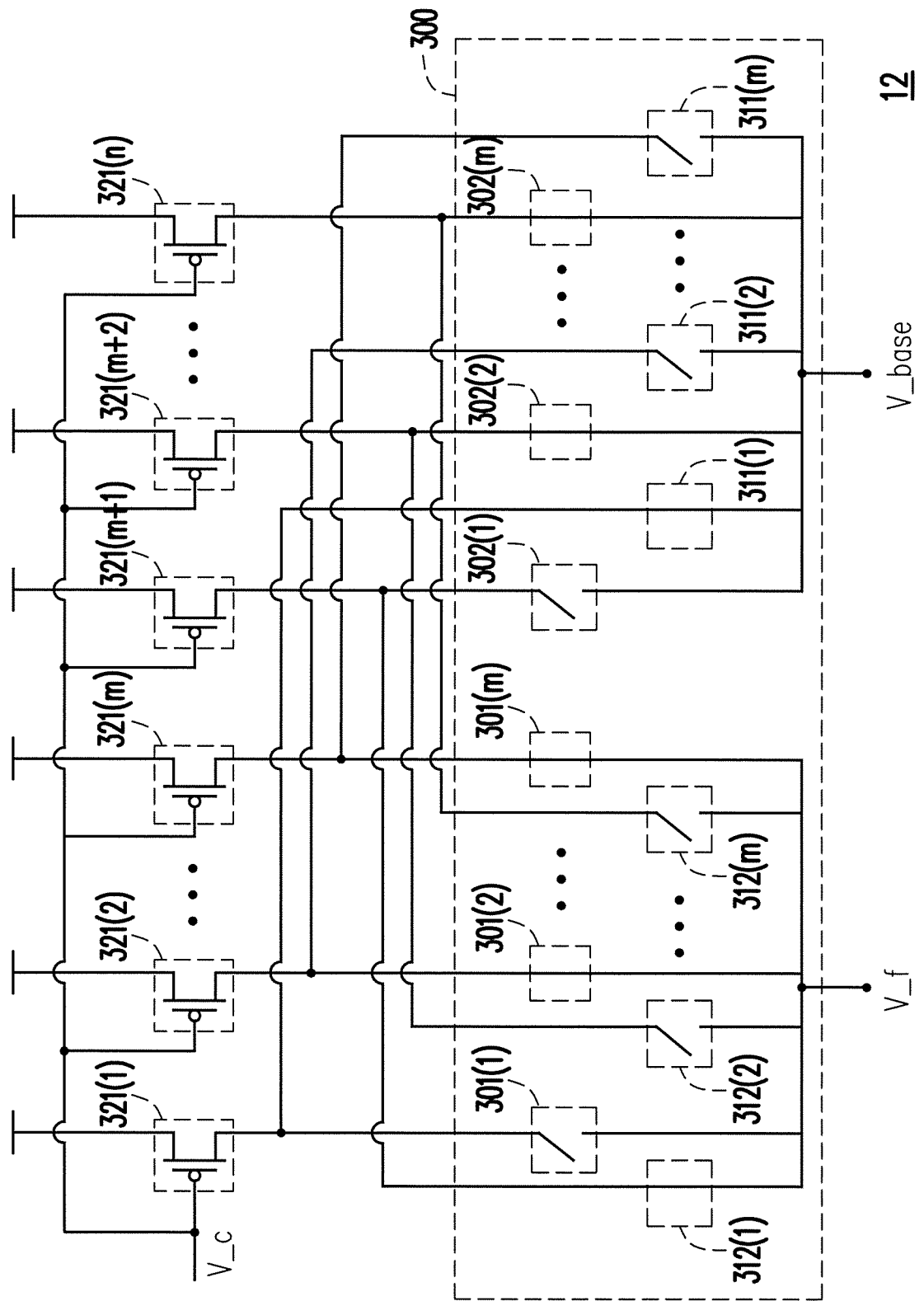

Referring to FIG. 2 and FIG. 3B, corresponding to a certain unit switch operation, the states of the switch units 301(1) and 302(1) are switched from the turn-on state to the turn-off state, and the states of the switch units 311(1) and 312(1) are switched from the turn-off state to the turn-on state. Therefore, the transistor unit 321(1) is switched to belong to the second type transistor unit, and the transistor unit 321(*m*+1) is switched to belong to the first type transistor unit. As a result, the transistor units 321(2)-321(*m*+1) coupled to the voltage supplying circuit 11 belong to the first type transistor units, and the transistor units 321(1) and 321(*m*+2)-321(*n*) coupled to the detection point D belong to the second type transistor units.

Figure 3C:
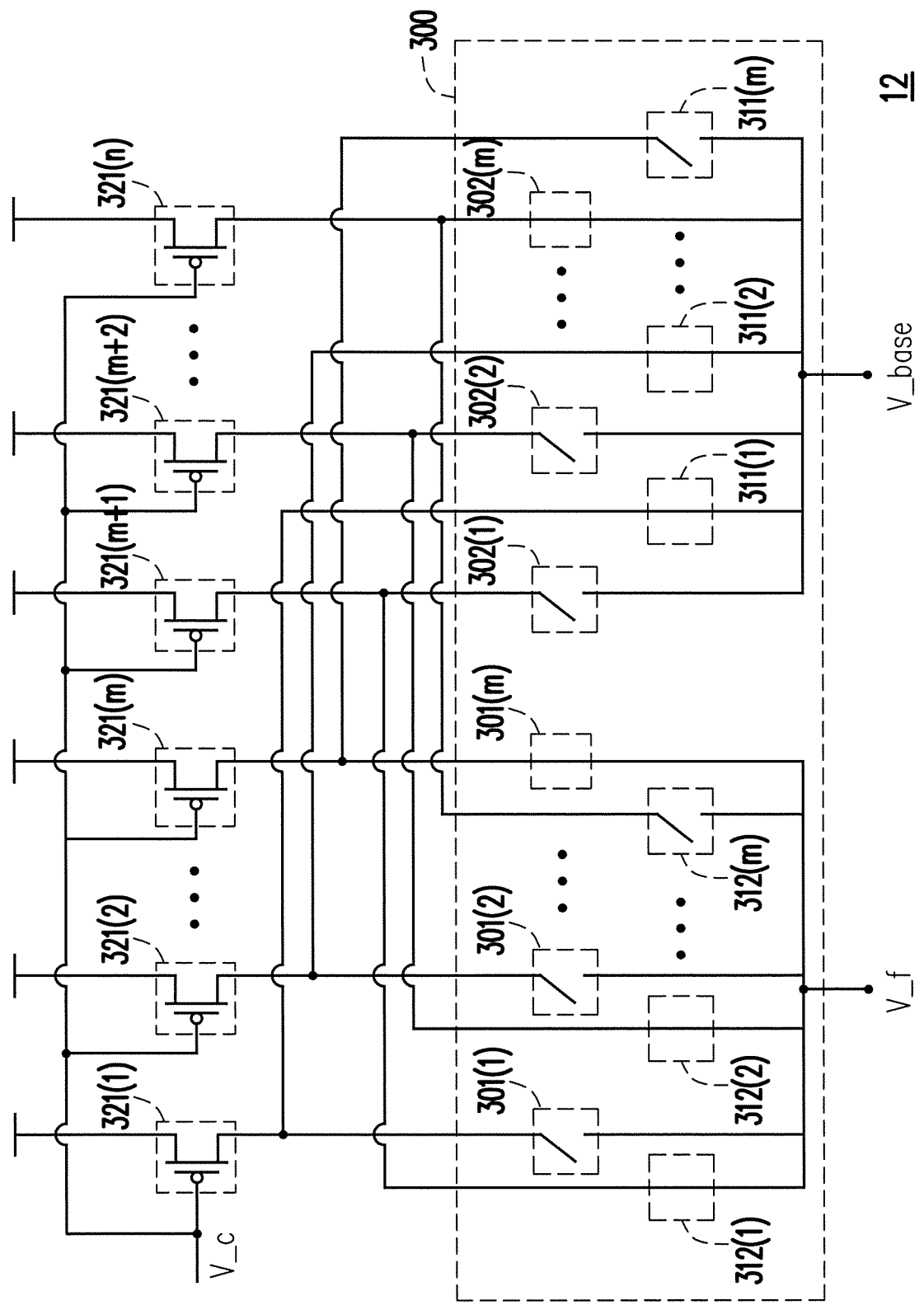

Referring to FIG. 2 and FIG. 3C, corresponding to another unit switch operation, the states of the switch units 301(2) and 302(2) are switched from the turn-on state to the turn-off state, and the states of the switch units 311(2) and 312(2) are switched from the turn-off state to the turn-on state. Therefore, the transistor unit 321(2) is switched to belong to the second type transistor unit, and the transistor unit 321(*m*+2) is switched to belong to the first type transistor unit. As a result, the transistor units 321(3)-321(*m*+2) coupled to the voltage supplying circuit 11 belong to the first type transistor units, and the transistor units 321(1), 321(2) and 321(*m*+3)-321(*n*) coupled to the detection point D belong to the second type transistor units. Deduced by analogy, in the $i^{th}$ unit switch operation, the states of the switch units 301(*i*), 302(*i*), 311(*i*) and 312(*i*) are switched, such that the transistor unit (*i*) is switched to the second type transistor unit, and the transistor unit (*m*+*i*) is switched to the first type transistor unit, where i is a positive integer and 0<i<(m+1).

Figure 3D:
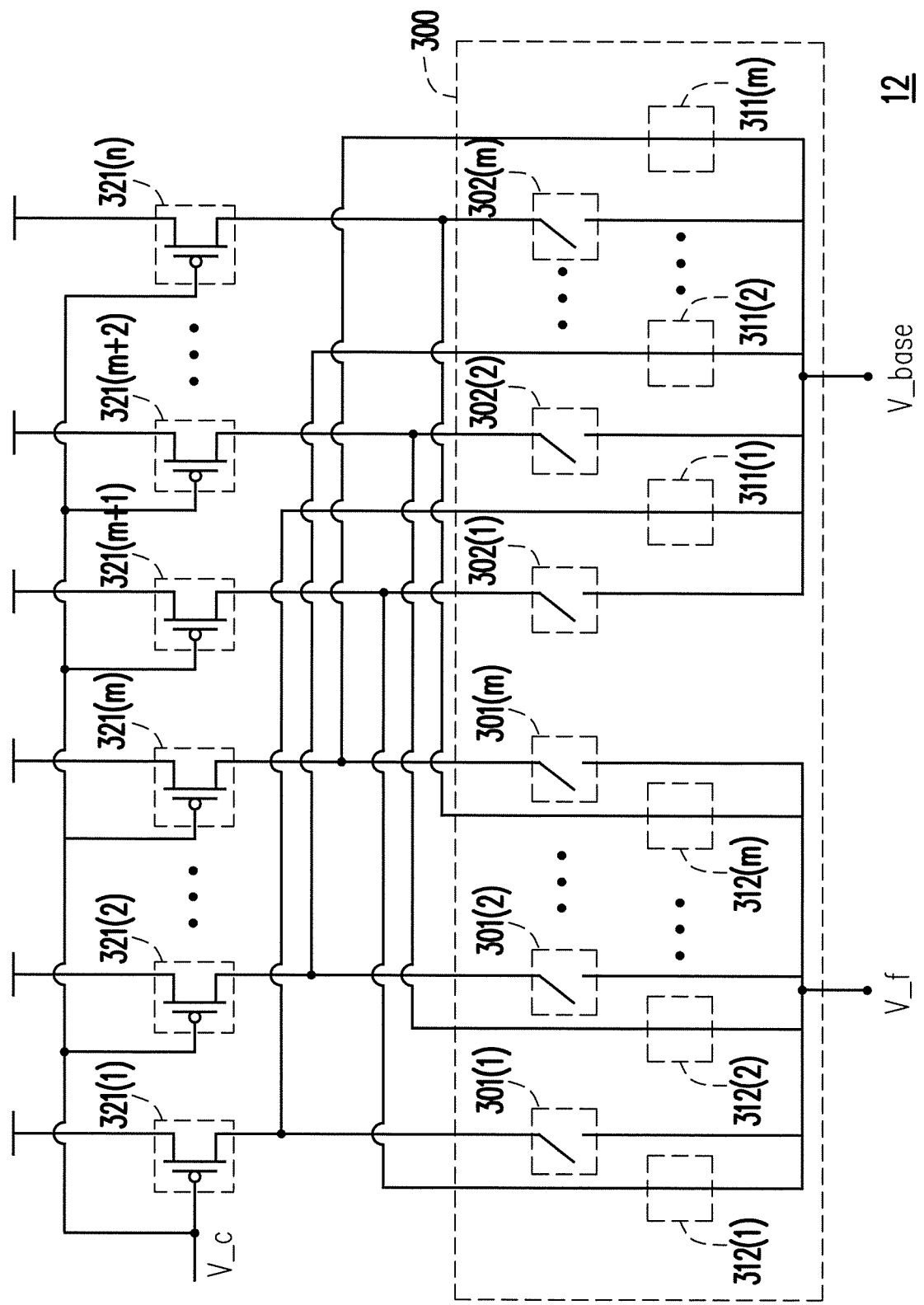

Referring to FIG. 3D, after m unit switch operations are performed, each of the switch units 301(1)-301(*m*) and 302(1)-302(*m*) is in the turn-off state, and each of the switch units 311(1)-311(*m*) and 312(1)-312(*m*) is in the turn-on state. In this case, the transistor units 321(*m*+1)-321(*n*) coupled to the voltage supplying circuit 11 belong to the first type transistor units, and the transistor units 321(1)-321(*m*) coupled to the detection point D belong to the second type transistor units.

In an exemplary embodiment, by exchanging the transistor units in the first type transistor units and the second type transistor units, the transistor units constructing the second type transistor units are changed, such that a voltage value of the base voltage V_base on the detection point D is correspondingly changed. For example, corresponding to the performed in unit switch operations, the voltage value of the base voltage V_base on the detection point D is probably changed by in times. Moreover, by exchanging the transistor units in the first type transistor units and the second type transistor units, reference voltage variation caused by process error of the transistor elements located at the two sides of the current mirror circuit may be mitigated. In other words, in an exemplary embodiment, the unit switch operation is configured to overcome the voltage variation caused by the process error of the transistor units.

It should be noted that in the aforementioned exemplary embodiment of FIGS. 3A-3D, the number of the first transistor unit and the number of the second transistor unit are all one. However, in another exemplary embodiment, the number of the first transistor units and the number of the second transistor units can also be plural. For example, in one unit switch operation, a plurality of the transistor units may probably be switched from belonging to the first type transistor units to belong to the second type transistor units, and a plurality of the transistor units may probably be switched from belonging to the second type transistor units to belong to the first type transistor units. Moreover, the circuit structure of FIGS. 3A-3D is merely one possible circuit structure used for executing the unit switch operation. In another exemplary embodiment, the unit switch circuit 12 may also have other type of circuit structure, as long as the unit switch operation can be executed.

In an exemplary embodiment, the operation of exchanging the transistor units in the first type transistor units and the second type transistor units (i.e. the unit switch operation) is executed according to a switch rule. The switch rule is used for specifying how to execute the unit switch operation. For example, according to the switch rule, the transistor units (i.e. the first type transistor unit and the second transistor unit) to be switched in each unit switch operation are probably selected randomly or selected according to a predetermined sequence. Moreover, in an exemplary embodiment, after multiple (for example, m times of) unit switch operations are executed, a plurality of transistor units original belonging to the first type transistor units are all switched to be belonging to the second type transistor units, and a plurality of transistor units original belonging to the second type transistor units are all switched to be belonging to the first type transistor units.

Referring back to FIG. 2, the voltage output circuit 13 includes a voltage adjusting circuit 23. The voltage adjusting circuit 23 is coupled to the voltage supplying circuit 11 and the detection point D. The voltage adjusting circuit 23 is configured to receive a control voltage V_c' from the voltage supplying circuit 11, where a voltage value of the control voltage V_c' is probably equal to or not equal to the voltage value of the control voltage V_c. The voltage adjusting circuit 23 is further configured to continuously receive a reference voltage V_ref and the plurality of base voltages V_base, and continuously adjust (i.e., modify) the reference voltage V_ref. For example, if a voltage value of the current reference voltage V_ref is higher than a voltage value of the current base voltage (which is also referred to as a third base voltage) V_base, the voltage adjusting circuit 23 decreases the voltage value of the reference voltage V_ref from the current voltage value (which is also referred to as a first voltage value) to another voltage value (which is also referred to as a second voltage value). Conversely, if the voltage value of the current reference voltage V_ref is lower than the voltage value of the current base voltage V_base, the voltage adjusting circuit 23 increases the voltage value of the reference voltage V_ref from the current voltage value to another voltage value (which is also referred to as a third voltage value). In an exemplary embodiment, the aforementioned operation of adjusting the voltage value of the reference voltage V_ref is also referred to as a reference voltage adjusting operation. In an exemplary embodiment, one reference voltage adjusting operation is executed corresponding to execution of one unit switch operation. Moreover, in an exemplary embodiment, after m times of the reference voltage adjusting operations are executed, the output reference voltage V_ref is in a stable state.

Figure 4:
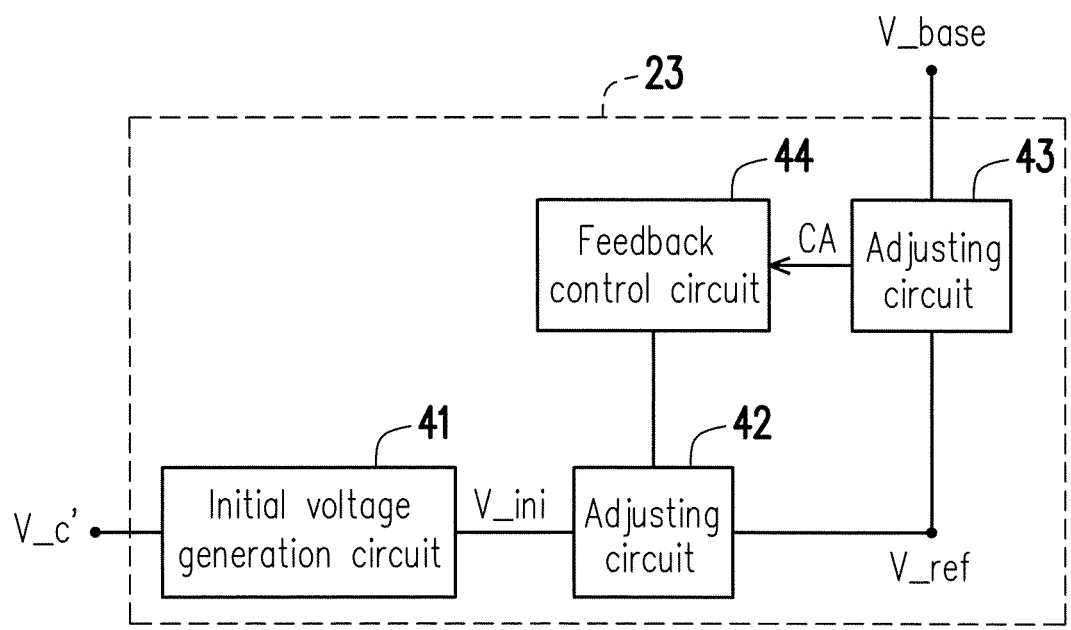
FIG. 4 is a function block schematic diagram of a voltage adjusting circuit according to an exemplary embodiment of the disclosure.

FIG. 4 is a function block schematic diagram of a voltage adjusting circuit according to an exemplary embodiment of the disclosure.

Referring to FIG. 4, in the present exemplary embodiment, the voltage adjusting circuit 23 includes an initial voltage generation circuit 41, an adjusting circuit (which is also referred to as a first adjusting circuit) 42, an adjusting circuit (which is also referred to as a second adjusting circuit) 43 and a feedback control circuit 44. The adjusting circuit 42 is coupled to the initial voltage generation circuit 41, the adjusting circuit 43 and the feedback control circuit 44. The adjusting circuit 43 is further coupled to the feedback control circuit 44.

The initial voltage generation circuit 41 is configured to receive the control voltage V_c' from the voltage supplying circuit 11 and generate an initial voltage V_ini. A voltage value of the initial voltage V_ini corresponds to an initial voltage value of the reference voltage V_ref. The adjusting circuit 42 is configured to generate the reference voltage V_ref according to the initial voltage V_ini. The adjusting circuit 43 is configured to receive the reference voltage V_ref and the base voltage V_base and generate a comparison signal CA. The feedback control circuit 44 is configured to control the adjusting circuit 42 to adjust the reference voltage V_ref according to the comparison signal CA. For example, the adjusting circuit 42 may be controlled by the feedback control circuit 44 to increase or decrease the voltage value of the reference voltage V_ref. Detail of the voltage adjusting circuit 23 in one exemplary embodiment is further described below.

Figure 5:
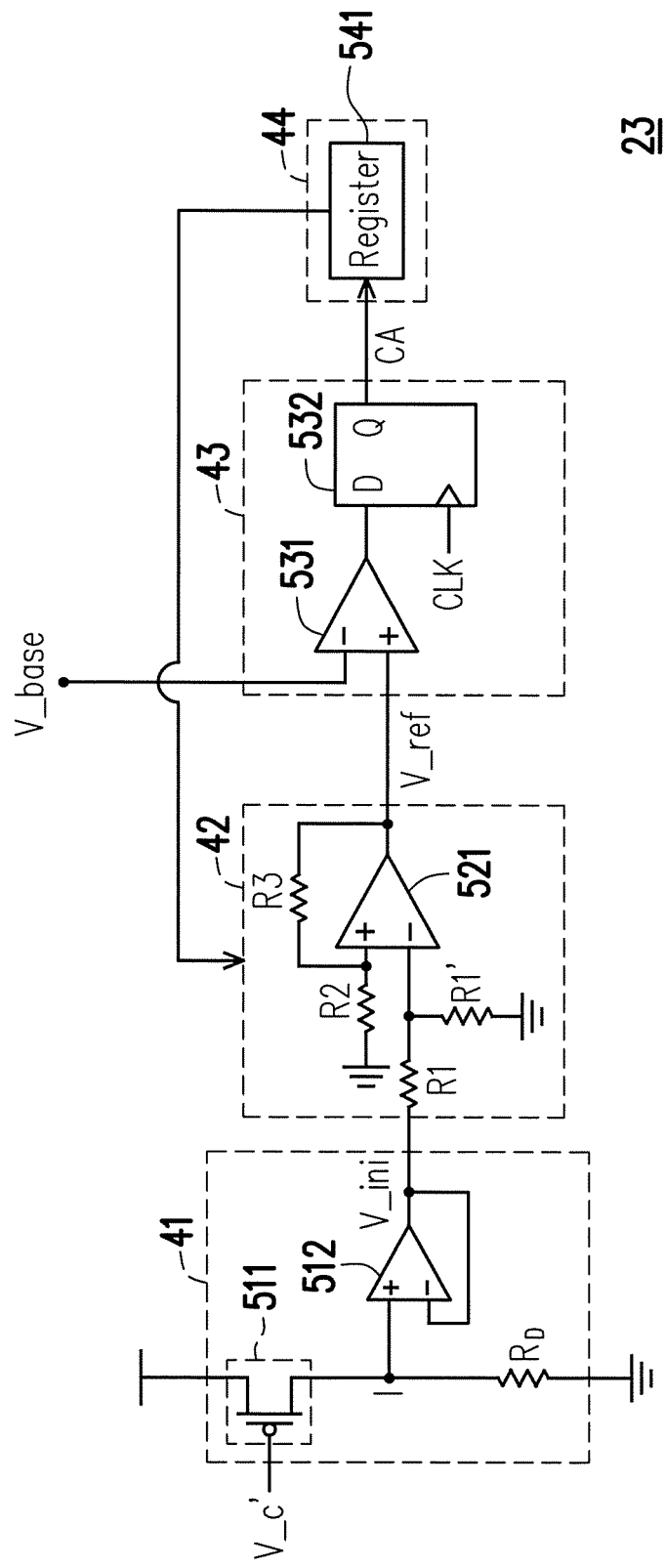
FIG. 5 is a circuit schematic diagram of a voltage adjusting circuit according to an exemplary embodiment of the disclosure.

FIG. 5 is a circuit schematic diagram of a voltage adjusting circuit according to an exemplary embodiment of the disclosure.

Referring to FIG. 5, in the present exemplary embodiment, the initial voltage generation circuit 41 includes a transistor unit 511, an operational amplifier 512 and an impedance unit $R_D$. An impedance value provided by the impedance unit $R_D$ is the same to the impedance value provided by the impedance unit $R_D$ in FIG. 2. A control terminal of the transistor unit 511 is coupled to the voltage supplying circuit 11 and is configured to receive the control voltage V_c'. An input terminal of the transistor unit 511 is coupled to a voltage source. An output terminal of the transistor unit 511 is coupled to an input terminal of the operational amplifier 512. The impedance unit $R_D$ is connected in series between the transistor unit 511 and a ground level. Moreover, an output terminal of the operational amplifier 512 is coupled to an input terminal of the adjusting circuit 42. To be specific, the transistor unit 511 provides a voltage on a detection point I, and a voltage value of the voltage is close to the voltage value of the base voltage V_base on the detection point D. The operational amplifier 512 generates the initial voltage V_ini according to the voltage on the detection point I.

In the present exemplary embodiment, the adjusting circuit 42 includes an operational amplifier (which is also referred to as a first operational amplifier) 521, an impedance unit $R_1$, an impedance unit $R_1'$, and impedance unit (which is also referred to as a first variable impedance unit) $R_2$ and an impedance unit (which is also referred to as a second variable impedance unit) $R_3$. An impedance value provided by the impedance unit $R_1$ is the same to an impedance value provided by the impedance unit $R_1'$. Impedance values provided by the impedance units $R_2$ and $R_3$ can be dynamically adjusted. To be specific, a first terminal of the impedance unit $R_2$ is grounded, a second terminal of the impedance unit $R_2$ is coupled to a first input terminal of the operational amplifier 521, a first terminal of the impedance unit $R_3$ is coupled to the first input terminal of the operational amplifier 521, and a second terminal of the impedance unit $R_3$ is coupled to an output terminal of the operational amplifier 521. Moreover, the reference voltage V_ref is generated at the output terminal of the operational amplifier 521.

In the present exemplary embodiment, the adjusting circuit 43 includes an operational amplifier 531 and a sampling circuit 532. A first input terminal of the operational amplifier 531 is configured to receive the reference voltage V_ref, and a second input terminal of the operational amplifier 531 is configured to receive the base voltage V_base. The sampling circuit 532 is coupled to an output terminal of the operational amplifier 531 and is configured to sample the output of the operational amplifier 531 base on a clock signal CLK. According to a sampling result, the sampling circuit 532 outputs the comparison signal CA. For example, in the present exemplary embodiment, the sampling circuit 532 includes a D-type flip-flop.

In the present exemplary embodiment, the feedback control circuit 44 includes a register 541. The feedback control circuit 44 updates an impedance parameter recorded in the register 541 according to the comparison signal CA. The feedback control circuit 44 adjusts the impedance values of the impedance unit $R_2$ and/or the impedance unit $R_3$ according to the impedance parameter. According to the adjusted impedance values, the voltage value of the reference voltage V_ref output by the adjusting circuit 42 is correspondingly changed.

Figure 6:
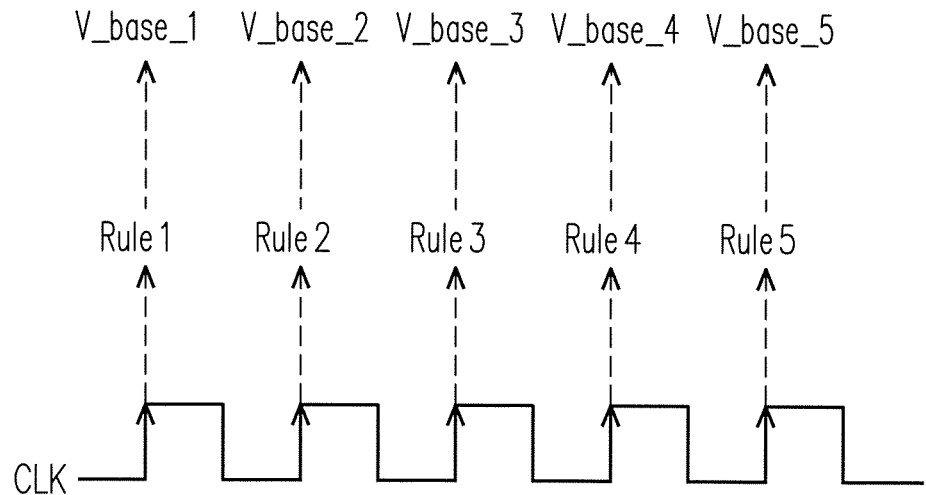
FIG. 6 is a schematic diagram of triggering a unit switch operation by a clock signal according to an exemplary embodiment of the disclosure.

FIG. 6 is a schematic diagram of triggering the unit switch operation by a clock signal according to an exemplary embodiment of the disclosure.

Referring to FIG. 6, in the present exemplary embodiment, the unit switch operation and the reference voltage adjusting operation are both triggered by a clock edge of the clock signal CLK. For example, in response to 5 continuous rising edges of the clock signal CLK, rule 1 to rule 5 are sequentially used to disturb (or exchange) the transistor units in the unit switch circuit 12, and 5 base voltages V_base_1-V_base_5 with different voltage values are sequentially generated on the detection point D. In response to the base voltages V_base_1-V_base_5, the reference voltage V_ref is continuously adjusted (i.e. modified), such that the voltage value of the reference voltage V_ref gradually approaches to an average voltage value of the base voltages V_base_1-V_base_5 (or more base voltages).

In an exemplary embodiment of FIG. 4 (or FIG. 5) and FIG. 6, an initial voltage value of the reference voltage V_ref is set corresponding to the voltage value of the initial voltage V_ini. After the $i^{th}$ unit switch operation is executed corresponding to the rule i, a base voltage V_base_i is generated. In the $i^{th}$ reference voltage adjusting operation, the adjusting circuit 43 compares the base voltage V_base_i and the current reference voltage V_ref. If the voltage value of the current reference voltage V_ref is higher than the voltage value of the base voltage V_base_i, the feedback control circuit 44 controls the adjusting circuit 42 to decrease the voltage value of the reference voltage V_ref. For example, the feedback control circuit 44 may increase the impedance value of the impedance unit $R_2$ from one impedance value (which is also referred to as a first impedance value) to another impedance value (which is also referred to as a second impedance value). Corresponding to the increase of the impedance value of the impedance unit $R_2$, the voltage value of the reference voltage V_ref is decreased. Conversely, if the voltage value of the current reference voltage V_ref is lower than the voltage value of the base voltage V_base_i, the feedback control circuit 44 may control the adjusting circuit 42 to increase the voltage value of the reference voltage V_ref. For example, the feedback control circuit 44 may increase the impedance value of the impedance unit $R_3$ from one impedance value (which is also referred to as a third impedance value) to another impedance value (which is also referred to as a fourth impedance value). Corresponding to the increase of the impedance value of the impedance unit $R_3$, the voltage value of the reference voltage V_ref is increased.

It should be noted that in an exemplary embodiment, in order to stably adjust the reference voltage V_ref, a rising amplitude of the voltage value of the reference voltage V_ref in one reference voltage adjusting operation is equal to a falling amplitude of the voltage value of the reference voltage V_ref in another reference voltage adjusting operation. Alternatively, according to another aspect, a difference value between the first impedance value and the second impedance value is equal to a difference value between the third impedance value and the fourth impedance value. Moreover, after the reference voltage V_ref is in the stable state, the reference voltage V_ref can be used for generating a specific voltage with a specific voltage value. For example, the specific voltage value can be 5 volt (V) or more or less.

It should be noted that although FIG. 2 to FIG. 5 illustrate a possible circuit layout of the reference voltage generation circuit of a part of the exemplary embodiments, in other exemplary embodiments that are not mentioned, a part of the electronic components in the reference voltage generation circuit can also be replaced by other types of the electronic components, coupling relationships of a part of the electronic components in the reference voltage generation circuit can also be changed, and/or more electronic components can be added into the reference voltage generation circuit as long as corresponding functions of the reference voltage generation circuit as mentioned can be satisfied.

In an exemplary embodiment, the reference voltage generation circuit (for example, the reference voltage generation circuit 10 of FIG. 1) is also referred to as a bandgap reference circuit. In an exemplary embodiment, the reference voltage generation circuit can be applied in various electronic devices to provide a reference voltage required for operations of the electronic devices. Alternatively, in another exemplary embodiment, the reference voltage generation circuit is applied in a memory storage device to provide a reference voltage required by the operation of the memory storage device.

Generally, the memory storage device (which is also referred to as a memory storage system) includes a rewritable non-volatile memory module and a controller (which is also referred to as a control circuit). Generally, the memory storage device is used together with a host system, and the host system may write data into the memory storage device or read data from the memory storage device.

Figure 7:
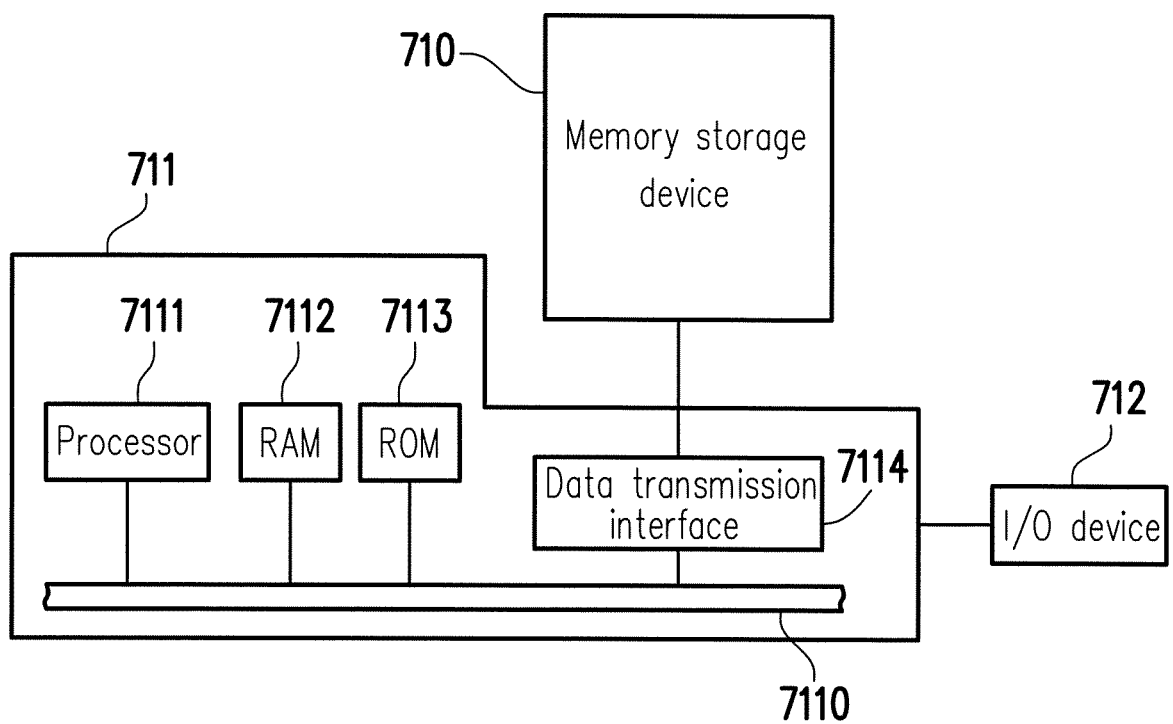
FIG. 7 is a schematic diagram of a host system, a memory storage device and an input/output (I/O) device according to an exemplary embodiment of the disclosure.
Figure 8:
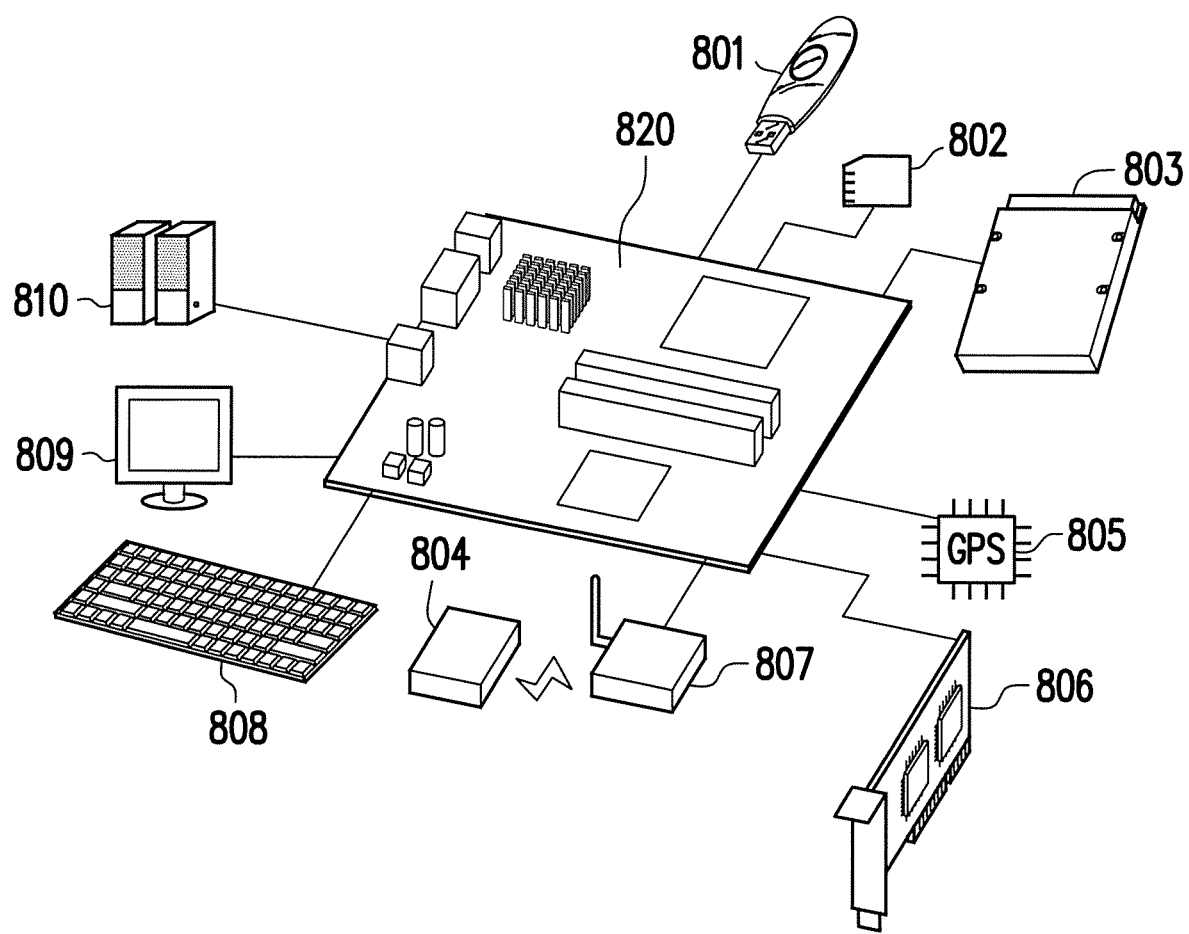
FIG. 8 is a schematic diagram of a host system, a memory storage device and an I/O device according to another exemplary embodiment of the disclosure.

FIG. 7 is a schematic diagram of a host system, a memory storage device and an input/output (I/O) device according to an exemplary embodiment of the disclosure. FIG. 8 is a schematic diagram of a host system, a memory storage device and an I/O device according to another exemplary embodiment of the disclosure.

Referring to FIG. 7 and FIG. 8, the host system 711 generally includes a processor 7111, a random access memory (RAM) 7112, a read only memory (ROM) 7113 and a data transmission interface 7114. The processor 7111, the RAM 7112, the ROM 7113 and the data transmission interface 7114 are all coupled to a system bus 7110.

In an exemplary embodiment, the host system 711 is coupled to the memory storage device 710 through the data transmission interface 7114. For example, the host system 711 may store data into the memory storage device 710 or read data from the memory storage device 710 through the data transmission interface 7114. Moreover, the host system 711 is coupled to the I/O device 712 through the system bus 7110. For example, the host system 711 may transmit an output signal to the I/O device 712 or receive an input signal from the I/O device 712 through the system bus 7110.

In the present exemplary embodiment, the processor 7111, the RAM 7112, the ROM 7113 and the data transmission interface 7114 can be disposed on a motherboard 820 of the host system 711. The number of the data transmission interface 7114 can be one or plural. Through the data transmission interface 7114, the motherboard 820 can be coupled to the memory storage device 710 through a wired or wireless manner. The memory storage device 710 is, for example, a flash drive 801, a memory card 802, a solid state drive (SSD) 803 or a wireless memory storage device 802. The wireless memory storage device 804 is, for example, a memory storage device based on various wireless communication techniques such as a near field communication (NFC) memory storage device, a WiFi memory storage device, a Bluetooth memory storage device or a low power Bluetooth memory storage device (for example, iBeacon), etc. Moreover, the motherboard 820 can also be coupled to various I/O devices such as a global positioning system (GPS) module 805, a network interface card 806, a wireless transmission device 807, a keyboard 808, a screen 809, a loudspeaker 810, etc., through the system bus 7110. For example, in an exemplary embodiment, the motherboard 820 may access the wireless memory storage device 804 through the wireless transmission device 807.

Figure 9:
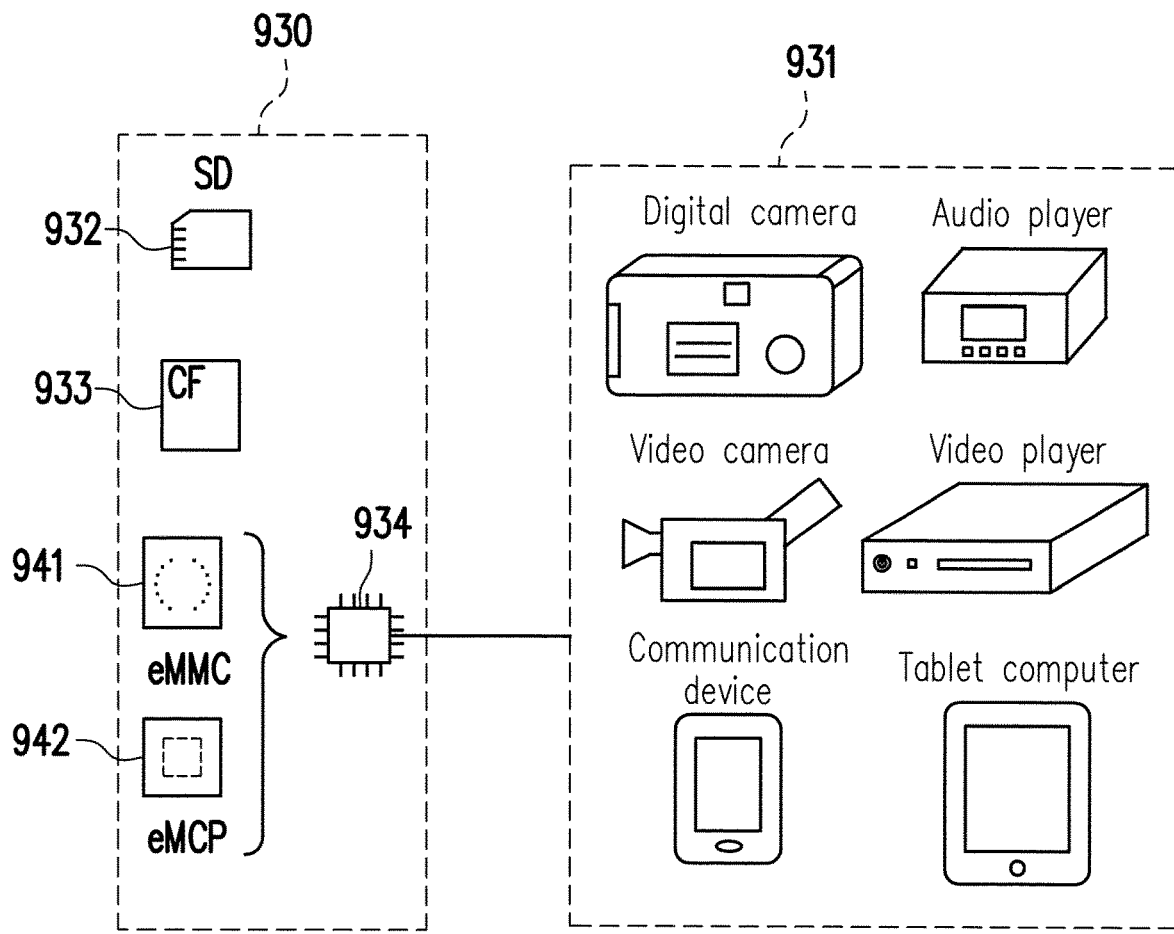
FIG. 9 is a schematic diagram of a host system and a memory storage device according to another exemplary embodiment of the disclosure.

In an exemplary embodiment, the aforementioned host system may be any system capable of substantially cooperating with the memory storage device to store data. In the aforementioned exemplary embodiment, the host system is, for example, a computer system. However, FIG. 9 is a schematic diagram of a host system and a memory storage device according to another exemplary embodiment of the disclosure. Referring to FIG. 9, in another exemplary embodiment, the host system 931 can also be a digital camera, a video camera, a communication device, an audio player, a video player or a tablet computer, etc., and the memory storage device 930 can be various non-volatile memory storage devices such as a secure digital (SD) card 932, a compact flash (CF) card 933 or an embedded storage device 934, etc., that is adapted to be used by the host system 931. The embedded storage device 934 includes an embedded multimedia card (eMMC) 941 and/or an embedded multi-chip package (eMCP) storage device 942, etc., where a memory module is directly coupled to a substrate of the host system.

Figure 10:
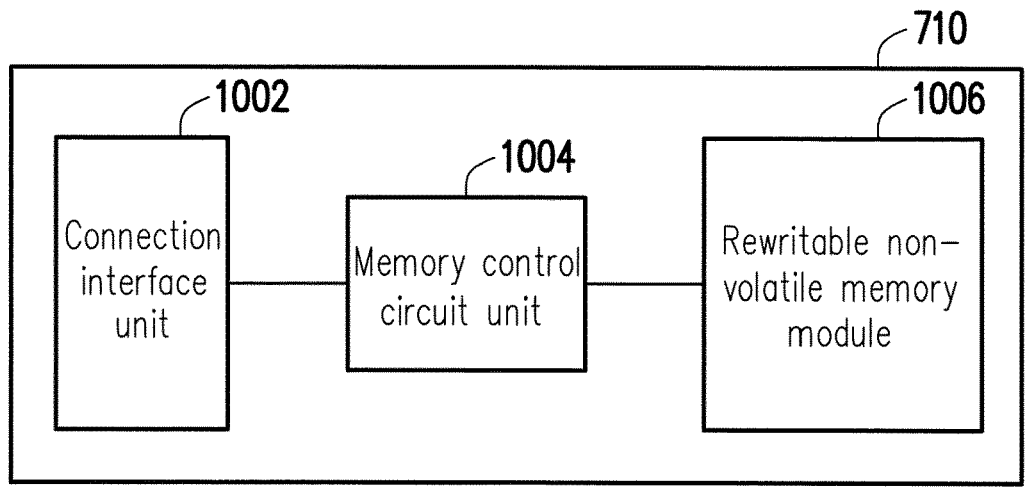
FIG. 10 is a schematic diagram of a memory storage device according to an exemplary embodiment of the disclosure.

FIG. 10 is a schematic diagram of a memory storage device according to an exemplary embodiment of the disclosure.

Referring to FIG. 10, the memory storage device 710 includes a connection interface unit 1002, a memory control circuit unit 1004 and a rewritable non-volatile memory module 1006.

The connection interface unit 1002 is configured to couple the memory storage device 710 to the host system 711. In the present exemplary embodiment, the connection interface unit 1002 is compatible to a serial advanced technology attachment (SATA) standard. However, it should be noted that the disclosure is not limited thereto, and the connection interface unit 1002 can also be complied with a parallel advanced technology attachment (PATA) standard, an institute of electrical and electronic engineers (IEEE) 1394 standard, a peripheral component interconnect express (PCI express) standard, a universal serial bus (USB) standard, a SD interface standard, an ultra high speed-I (UHS-I) interface standard, an ultra high speed-II (UHS-II) interface standard, a memory stick (MS) interface standard, a MCP interface standard, a MMC interface standard, an eMMC interface standard, a universal flash storage (UFS) interface standard, an eMCP interface standard, a CF interface standard, an integrated device electronics (IDE) standard or other suitable standards. The connection interface unit 1002 and the memory control circuit unit 1004 can be packaged in one chip, or the connection interface unit 1002 is disposed outside a chip containing the memory control circuit unit 1004.

The memory control circuit unit 1004 may execute a plurality of logic gates or control instructions implemented in a hardware form or a firmware form, and may perform a writing operation, a reading operation or an erasing operation on the rewritable non-volatile memory module 1006 according to commands of the host system 711.

The rewriteable non-volatile memory module 1006 is coupled to the memory control circuit unit 1004 and is used for storing data written by the host system 11. The rewriteable non-volatile memory module 1006 can be a single level cell (SLC) NAND flash memory module (i.e., a flash memory module with one memory cell storing data of one bit), a multi level cell (MLC) NAND flash memory module (i.e., a flash memory module with one memory cell storing data of two bits), a triple level cell (TLC) NAND flash memory module (i.e., a flash memory module with one memory cell storing data of three bits), other flash memory modules or other memory modules having the same characteristic.

Each of the memory cells of the rewriteable non-volatile memory module 1006 stores one or a plurality of bits through changing of a voltage (which is also referred to as a threshold voltage hereinafter). To be specific, a charge trapping layer is provided between a control gate and a channel of each memory cell. By applying a writing voltage to the control gate, an amount of electrons of the charge trapping layer can be changed, so as to change the threshold voltage of the memory cell. The operation of changing the threshold voltage of the memory cell is referred to as "writing data into the memory cell" or "programming the memory cell". Along with the change of the threshold voltage, each memory cell of the rewriteable non-volatile memory module 1006 has a plurality of storage states. By applying a reading voltage, the storage state of a certain memory cell can be determined, so as to obtain one or a plurality of bits stored in the memory cell.

In the present exemplary embodiment, the memory cells of the rewritable non-volatile memory module 1006 construct a plurality of physical programming units, and the physical programming units construct a plurality of physical erasing unit. To be specific, the memory cells on the same word line consist one or a plurality of physical programming units. If one memory cell can store two or more bits, the physical programming units on the same word line can be at least categorized into a lower physical programming unit and an upper physical programming unit. For example, a least significant bit (LSB) of one memory cell belongs to the lower physical programming unit, and a most significant bit (MSB) of one memory cell belongs to the upper physical programming unit. Generally, in an MLC NAND flash memory, a writing speed of the lower physical programming unit is faster than that of the upper physical programming unit, and/or reliability of the lower physical programming unit is higher than that of the upper physical programming unit.

In the present exemplary embodiment, physical programming unit is the smallest unit for programming data. Namely, physical programming unit is the smallest unit for writing data. For example, the physical programming unit is a physical page or a physical sector. If the physical programming unit is physical page, the physical programming unit generally includes a data bit area and a redundant bit area. The data bit area includes a plurality of physical sectors and is configured for storing user data, and the redundant bit area is configured for storing system data (for example, error checking and correcting (ECC) codes). In the present exemplary embodiment, each data bit area includes 32 physical sectors, and the size of one physical sector is 512 bytes (B). However, in other exemplary embodiments, the data bit area may also include 8, 16 or more or less physical sectors, and the size of each physical sector can be larger or smaller. On the other hand, physical erasing unit is the smallest unit for erasing data. Namely, each physical erasing unit contains the least number of memory cells that are erased all together. For example, the physical erasing unit is a physical block.

In an exemplary embodiment, the reference voltage generation circuit (for example, the reference voltage generation circuit 10 of FIG. 1) is disposed in the connection interface unit 1002 or the memory control circuit unit 1004 for providing a reference voltage required by operations of the connection interface unit 1002 and/or the memory control circuit unit 1004. Moreover, in another exemplary embodiment, the reference voltage generation circuit can also be disposed in the rewritable non-volatile memory module 1006 for providing a reference voltage required by the operation of the rewritable non-volatile memory module 1006.

Figure 11:
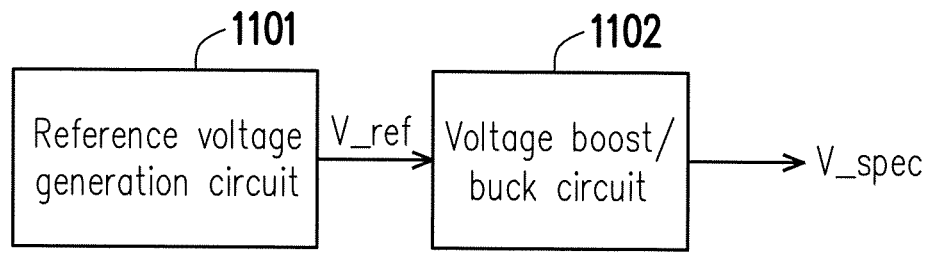
FIG. 11 is a schematic diagram of a connection interface unit according to an exemplary embodiment of the disclosure.

FIG. 11 is a schematic diagram of a connection interface unit according to an exemplary embodiment of the disclosure.

Referring to FIG. 11, in an exemplary embodiment, the connection interface unit 1002 includes a reference voltage generation circuit 1101 and a voltage boost/buck circuit 1102. The reference voltage generation circuit 1101 is the same or similar to the reference voltage generation circuit 10 of FIG. 1. After the reference voltage generation circuit 1101 generates the reference voltage V_ref in the stable state, the voltage boost/buck circuit 1102 may increase or decrease a voltage value of the reference voltage V_ref to output a specific voltage V_spec with a specific voltage value. For example, the voltage boost/buck circuit 1102 may include at least one voltage divider circuit. The specific voltage V_spec can be provided to one or a plurality of electronic devices in the memory storage device 710 for usage.

Figure 12:
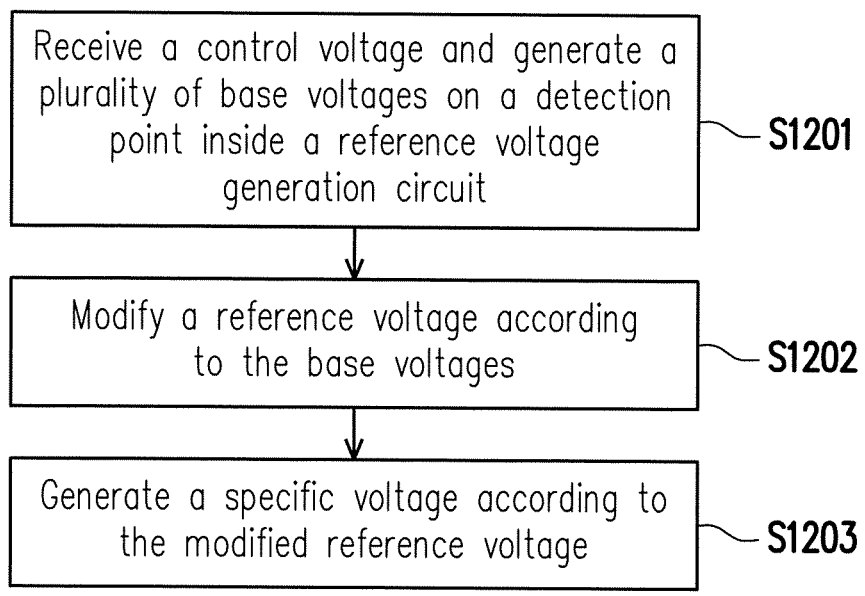
FIG. 12 is a flowchart illustrating a reference voltage generation method according to an exemplary embodiment of the disclosure.

FIG. 12 is a flowchart illustrating a reference voltage generation method according to an exemplary embodiment of the disclosure.

Referring to FIG. 12, in step S1201, a control voltage is received and a plurality of base voltages is generated on a detection point inside a reference voltage generation circuit. In step S1202, a reference voltage is modified according to the base voltages. In step S1203, a specific voltage is generated according to the modified reference voltage.

However, various steps of FIG. 12 have been described above, and detail thereof is not repeated. It should be noted that the various steps in FIG. 12 can be implemented as a plurality of program codes or circuits, which is not limited by the disclosure. Moreover, the method of FIG. 12 can be used in collaboration with the aforementioned exemplary embodiment, and can be used independently, which is not limited by the disclosure.

In summary, after the control voltage is received, the reference voltage generation circuit generates a plurality of base voltages on one detection point inside the reference voltage generation circuit based on a switch rule. Then, the reference voltage generation circuit continuously modifies a reference voltage according to the base voltages. Thereafter, the reference voltage can be used for generating a specific voltage with a specific voltage value. Compared to the technique of directly using an output voltage of a transistor located at one side of a current mirror as the reference voltage, the disclosure decreases the influence (variation) on the reference voltage due to process error of the transistors at two sides of the current mirror.

The previously described exemplary embodiments of the present disclosure have the advantages aforementioned, wherein the advantages aforementioned not required in all versions of the disclosure.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A reference voltage generation circuit, disposed in a memory storage device comprising a connection interface unit coupled to a host system, a rewritable non-volatile memory module having a plurality of physical units, and a memory control circuit unit coupled to the connection interface unit and the rewritable non-volatile memory module, wherein the reference voltage generation circuit is disposed in the connection interface unit or the memory control circuit unit, comprising:
   a voltage supplying circuit, configured to provide a control voltage;
   a unit switch circuit, coupled to the voltage supplying circuit and configured to receive the control voltage and generate a plurality of base voltages on a detection point inside the reference voltage generation circuit; and
   a voltage output circuit, coupled to the unit switch circuit and configured to modify a reference voltage for generating a specific voltage according to a voltage change of the plurality of base voltages.

2. The reference voltage generation circuit as claimed in claim 1, wherein the plurality of base voltages comprise a first base voltage and a second base voltage, and the unit switch circuit comprises a plurality of transistor units,
   wherein a configured operation that the unit switch circuit generates the plurality of base voltages on the detection point inside the reference voltage generation circuit comprises:
   generating the first base voltage on the detection point;
   executing a unit switch operation on the plurality of transistor units after the first base voltage is generated; and
   generating the second base voltage on the detection point after the unit switch operation is executed.

3. The reference voltage generation circuit as claimed in claim 2, wherein the plurality of transistor units comprise at least one first type transistor unit and at least one second type transistor unit, wherein the at least one first type transistor unit is configured to receive the control voltage and provide a feedback voltage to an input terminal of the voltage supplying circuit,
   wherein the at least one second type transistor unit is configured to receive the control voltage and provide the plurality of base voltages to the detection point.

4. The reference voltage generation circuit as claimed in claim 3, wherein the unit switch operation comprises at least one of a first unit switch operation and a second unit switch operation,
   wherein the first unit switch operation comprises:
   changing a first transistor unit in the plurality of transistor units from being one of the at least one first type transistor unit to be one of the at least one second type transistor unit,
   wherein the second unit switch operation comprises:
   changing a second transistor unit in the plurality of transistor units from being one of the at least one second type transistor unit to be one of the at least one first type transistor unit.

5. The reference voltage generation circuit as claimed in claim 3, wherein a total number of the at least one first type transistor unit is equal to a total number of the at least one second type transistor unit.

6. The reference voltage generation circuit as claimed in claim 1, wherein the voltage output circuit comprises:
   a voltage adjusting circuit, configured to receive the reference voltage and the plurality of base voltages,
   wherein the voltage adjusting circuit decreases a voltage value of the reference voltage from a first voltage value to a second voltage value if the reference voltage is higher than a third base voltage in the plurality of base voltages,
   wherein the voltage adjusting circuit increases the voltage value of the reference voltage from the first voltage value to a third voltage value if the reference voltage is lower than the third base voltage.

7. The reference voltage generation circuit as claimed in claim 6, wherein the voltage adjusting circuit comprises:
   a first adjusting circuit;
   a second adjusting circuit, coupled to the first adjusting circuit; and
   a feedback control circuit, coupled to the second adjusting circuit,
   wherein the first adjusting circuit is configured to generate the reference voltage according to an initial voltage,
   wherein the second adjusting circuit is configured to receive the reference voltage and the plurality of base voltages and generate a comparison signal,
   wherein the feedback control circuit is configured to control the first adjusting circuit to adjust the reference voltage according to the comparison signal.

8. The reference voltage generation circuit as claimed in claim 7, wherein the first adjusting circuit comprises a first operational amplifier,
   wherein the reference voltage is generated at an output terminal of the first operational amplifier.

9. The reference voltage generation circuit as claimed in claim 8, wherein the first adjusting circuit further comprises a first variable impedance unit and a second variable impedance unit,
wherein a first terminal of the first variable impedance unit is grounded, and a second terminal of the first variable impedance unit is coupled to a first input terminal of the first operational amplifier,
wherein a first terminal of the second variable impedance unit is coupled to the first input terminal of the first operational amplifier, and a second terminal of the second variable impedance unit is coupled to the output terminal of the first operational amplifier.

10. The reference voltage generation circuit as claimed in claim 9, wherein a configured operation that the feedback control circuit controls the first adjusting circuit according to the comparison circuit comprises:
increasing an impedance value of the first variable impedance unit from a first impedance value to a second impedance value if the reference voltage is higher than the third base voltage; and
increasing an impedance value of the second variable impedance unit from a third impedance value to a fourth impedance value if the reference voltage is lower than the third base voltage.

11. The reference voltage generation circuit as claimed in claim 7, wherein the second adjusting circuit comprises a second operational amplifier,
wherein a first input terminal of the second operational amplifier is configured to receive the reference voltage,
wherein a second input terminal of the second operational amplifier is configured to receive the plurality of base voltages,
wherein an output terminal of the second operational amplifier is configured to generate the comparison signal.

12. The reference voltage generation circuit as claimed in claim 7, wherein the voltage adjusting circuit further comprises an initial voltage generation circuit coupled to the first adjusting circuit and configured to generate the initial voltage,
wherein a voltage value of the initial voltage corresponds to an initial voltage value of the reference voltage.

13. The reference voltage generation circuit as claimed in claim 1, wherein the plurality of base voltages are sequentially generated based on a plurality of clock edges of a clock signal.

14. The reference voltage generation circuit as claimed in claim 2, wherein the unit switch operation is executed based on a clock edge of a clock signal.

15. The reference voltage generation circuit as claimed in claim 3, wherein the unit switch circuit is further configured to generate a mapping current flowing through the at least one second type transistor unit according to a reference current flowing through the at least one first type transistor unit.

16. A memory storage device, comprising:
a connection interface unit, coupled to a host system;
a rewritable non-volatile memory module, comprising a plurality of physical units;
a memory control circuit unit, coupled to the connection interface unit and the rewritable non-volatile memory module; and
a reference voltage generation circuit, disposed in the connection interface unit or the memory control circuit unit,
wherein the reference voltage generation circuit is configured to receive a control voltage and generate a plurality of base voltages on a detection point inside the reference voltage generation circuit,
wherein the reference voltage generation circuit is further configured to modify a reference voltage for generating a specific voltage according to a voltage change of the plurality of base voltages.

17. The memory storage device as claimed in claim 16, wherein the plurality of base voltages comprise a first base voltage and a second base voltage, and the reference voltage generation circuit comprises a plurality of transistor units,
wherein a configured operation that the reference voltage generation circuit generates the plurality of base voltages on the detection point inside the reference voltage generation circuit comprises:
generating the first base voltage on the detection point;
executing a unit switch operation on the plurality of transistor units after the first base voltage is generated; and
generating the second base voltage on the detection point after the unit switch operation is executed.

18. The memory storage device as claimed in claim 17, wherein the reference voltage generation circuit further comprises a voltage supplying circuit coupled to the plurality of transistor units and configured to generate the control voltage,
wherein the plurality of transistor units comprise at least one first type transistor unit and at least one second type transistor unit,
wherein the at least one first type transistor unit is configured to receive the control voltage and provide a feedback voltage to an input terminal of the voltage supplying circuit,
wherein the at least one second type transistor unit is configured to receive the control voltage and provide the plurality of base voltages to the detection point.

19. The memory storage device as claimed in claim 18, wherein the unit switch operation comprises at least one of a first unit switch operation and a second unit switch operation,
wherein the first unit switch operation comprises:
changing a first transistor unit in the plurality of transistor units from being one of the at least one first type transistor unit to be one of the at least one second type transistor unit,
wherein the second unit switch operation comprises:
changing a second transistor unit in the plurality of transistor units from being one of the at least one second type transistor unit to be one of the at least one first type transistor unit.

20. The memory storage device as claimed in claim 18, wherein a total number of the at least one first type transistor unit is equal to a total number of the at least one second type transistor unit.

21. The memory storage device as claimed in claim 16, wherein the reference voltage generation circuit comprises:
a voltage adjusting circuit, configured to receive the reference voltage and the plurality of base voltages,
wherein the voltage adjusting circuit is configured to decrease a voltage value of the reference voltage from a first voltage value to a second voltage value if the reference voltage is higher than a third base voltage in the plurality of base voltages,
wherein the voltage adjusting circuit is further configured to increase the voltage value of the reference voltage from the first voltage value to a third voltage value if the reference voltage is lower than the third base voltage.

22. The memory storage device as claimed in claim 21, wherein the voltage adjusting circuit comprises:
    a first adjusting circuit;
    a second adjusting circuit, coupled to the first adjusting circuit; and
    a feedback control circuit, coupled to the second adjusting circuit,
    wherein the first adjusting circuit is configured to generate the reference voltage according to an initial voltage,
    wherein the second adjusting circuit is configured to receive the reference voltage and the plurality of base voltages and generate a comparison signal,
    wherein the feedback control circuit is configured to control the first adjusting circuit to adjust the reference voltage according to the comparison signal.

23. The memory storage device as claimed in claim 22, wherein the first adjusting circuit comprises a first operational amplifier,
    wherein the reference voltage is generated at an output terminal of the first operational amplifier.

24. The memory storage device as claimed in claim 23, wherein the first adjusting circuit further comprises a first variable impedance unit and a second variable impedance unit,
    wherein a first terminal of the first variable impedance unit is grounded, and a second terminal of the first variable impedance unit is coupled to a first input terminal of the first operational amplifier,
    wherein a first terminal of the second variable impedance unit is coupled to the first input terminal of the first operational amplifier, and a second terminal of the second variable impedance unit is coupled to the output terminal of the first operational amplifier.

25. The memory storage device as claimed in claim 24, wherein a configured operation that the feedback control circuit controls the first adjusting circuit according to the comparison circuit comprises:
    increasing an impedance value of the first variable impedance unit from a first impedance value to a second impedance value if the reference voltage is higher than the third base voltage; and
    increasing an impedance value of the second variable impedance unit from a third impedance value to a fourth impedance value if the reference voltage is lower than the third base voltage.

26. The memory storage device as claimed in claim 22, wherein the second adjusting circuit comprises a second operational amplifier,
    wherein a first input terminal of the second operational amplifier is configured to receive the reference voltage,
    wherein a second input terminal of the second operational amplifier is configured to receive the plurality of base voltages,
    wherein an output terminal of the second operational amplifier is configured to generate the comparison signal.

27. The memory storage device as claimed in claim 22, wherein the voltage adjusting circuit further comprises an initial voltage generation circuit coupled to the first adjusting circuit and configured to generate the initial voltage,
    wherein a voltage value of the initial voltage corresponds to an initial voltage value of the reference voltage.

28. The memory storage device as claimed in claim 16, wherein the plurality of base voltages are sequentially generated based on a plurality of clock edges of a clock signal.

29. The memory storage device as claimed in claim 17, wherein the unit switch operation is executed based on a clock edge of a clock signal.

30. The memory storage device as claimed in claim 18, wherein the reference voltage generation circuit is further configured to generate a mapping current flowing through the at least one second type transistor unit according to a reference current flowing through the at least one first type transistor unit.

31. A reference voltage generation method, adapted to a memory storage device having a connection interface unit, a rewritable non-volatile memory module, a memory control circuit unit, and a reference voltage generation circuit, and the reference voltage generation method comprising:
    receiving a control voltage and generating a plurality of base voltages on a detection point inside a reference voltage generation circuit;
    modifying a reference voltage according to a voltage change of the base voltages; and
    generating a specific voltage according to the modified reference voltage.

32. The reference voltage generation method as claimed in claim 31, wherein the plurality of base voltages comprise a first base voltage and a second base voltage, and the reference voltage generation circuit comprises a plurality of transistor units,
    wherein the step of generating the plurality of base voltages on the detection point inside the reference voltage generation circuit comprises:
    generating a first base voltage on the detection point;
    executing a unit switch operation on the plurality of transistor units after the first base voltage is generated; and
    generating the second base voltage on the detection point after the unit switch operation is executed.

33. The reference voltage generation method as claimed in claim 32, wherein the plurality of transistor units comprise at least one first type transistor unit and at least one second type transistor unit,
    wherein the step of generating the plurality of base voltages on the detection point inside the reference voltage generation circuit comprises:
    generating the control voltage by a voltage supplying circuit;
    receiving the control voltage by the at least one first type transistor unit and providing a feedback voltage to an input terminal of the voltage supplying circuit; and
    receiving the control voltage by the at least one second type transistor unit and providing the plurality of base voltages to the detection point.

34. The reference voltage generation method as claimed in claim 33, wherein the unit switch operation comprises at least one of a first unit switch operation and a second unit switch operation,
    wherein the first unit switch operation comprises:
    changing a first transistor unit in the plurality of transistor units from being one of the at least one first type transistor unit to be one of the at least one second type transistor unit,
    wherein the second unit switch operation comprises:
    changing a second transistor unit in the plurality of transistor units from being one of the at least one second type transistor unit to be one of the at least one first type transistor unit.

35. The reference voltage generation method as claimed in claim 33, wherein a total number of the at least one first type transistor unit is equal to a total number of the at least one second type transistor unit.

36. The reference voltage generation method as claimed in claim 31, wherein the step of modifying the reference voltage according to the plurality of base voltages comprises:
   receiving the reference voltage and the plurality of base voltages;
   decreasing a voltage value of the reference voltage from a first voltage value to a second voltage value if the reference voltage is higher than a third base voltage in the plurality of base voltages; and
   increasing the voltage value of the reference voltage from the first voltage value to a third voltage value if the reference voltage is lower than the third base voltage.

37. The reference voltage generation method as claimed in claim 31, wherein the plurality of base voltages are sequentially generated based on a plurality of clock edges of a clock signal.

38. The reference voltage generation method as claimed in claim 32, wherein the unit switch operation is executed based on a clock edge of a clock signal.

39. The reference voltage generation method as claimed in claim 33, further comprising:
   generating a mapping current flowing through the at least one second type transistor unit according to a reference current flowing through the at least one first type transistor unit.

* * * * *